US005828505A

United States Patent [19]
Farmiga

[11] Patent Number: 5,828,505
[45] Date of Patent: Oct. 27, 1998

[54] OPTICAL BEAM-SHAPER-UNIFORMIZER CONSTRUCTION

[75] Inventor: Nestor O. Farmiga, Clifton, N.J.

[73] Assignee: Anvik Corporation, Hawthorne, N.Y.

[21] Appl. No.: 644,773

[22] Filed: May 10, 1996

[51] Int. Cl.$^6$ ............................ G02B 5/08; G02B 7/182; G02B 27/08
[52] U.S. Cl. ........................ 359/857; 359/856; 359/861; 359/850; 359/616; 359/855; 385/133
[58] Field of Search .................................... 359/856, 857, 359/861, 850, 616, 855; 385/133

[56] References Cited

U.S. PATENT DOCUMENTS

| | | | |
|---|---|---|---|
| 4,065,204 | 12/1977 | Lipkins | 359/529 |
| 4,998,789 | 3/1991 | Atkins | 359/616 |

*Primary Examiner*—Paul M. Dzierzynski
*Assistant Examiner*—Mohammad Y. Sikder
*Attorney, Agent, or Firm*—Carl C. Kling

[57] ABSTRACT

An internally-mirrored tube of constant cross-section, for use as a beam-shaper-uniformizer in an optical lithography tool, requires precision assembly, closely approaching total internal reflection, to be able to accept at the entry end a beam of laser light of specified numerical aperture, having an arbitrary cross-section and a non-uniform intensity profile, and deliver at the exit a beam having the same numerical aperture, the desired cross-sectional shape, and a substantially uniform intensity profile across the illuminated area. Imperfections at the edges of the component slabs would interfere with operation. The difficulty of machining internal surfaces to mirror smoothness, and the difficulty of applying mirror finishes to internal surfaces, suggests that the uniformizer be assembled from mirrored slabs cemented together. Achieving precision without breakage or scuffing of mirrors is difficult. Precision and ease are supplied by a technique of using two parts, two of rectangular cross-section with mirrored flat side, and four (two complementary pairs) of trapezoidal cross-section with a mirrored 60° bevel-edge, in a stacked slab assembly. The stacked slabs are adjusted for alignment and cemented by external beads of epoxy, or clamped permanently.

15 Claims, 6 Drawing Sheets

OPTICAL BEAM-SHAPER-UNIFORMIZER CONSTRUCTION

BACKGROUND OF THE INVENTION

1. Field of the Invention

This invention relates to a construction for a polygonal beam-shaper-uniformizer which converts an input light beam of non-uniform intensity profile and given numerical aperture into a uniform, self-luminous output beam of desired polygonal cross-section having the same numerical aperture as the input beam, and, more particularly, this invention relates to a uniformizer construction which greatly reduces machining and assembly costs while maintaining precision.

2. Description of Related Art

This invention relates to lithography systems for exposing large substrates at high imaging resolution and high exposure throughputs; it specifically relates to the beam-shaper-uniformizer of the illumination system of a scan-and-repeat patterning system which utilizes a polygonal illumination field.

An illumination system producing a self-luminous light beam of selected cross-section, uniform intensity, and selected numerical aperture is described in U.S. Pat. No. 5,059,013, ILLUMINATION SYSTEM TO PRODUCE SELF-LUMINOUS LIGHT BEAM OF DESIRED CROSS-SECTION, UNIFORM INTENSITY, AND DESIRED NUMERICAL APERTURE, by K. Jain, issued Oct. 22, 1991. That illumination system plays a key role in a variety of large-area, high-throughput, lithographic patterning systems produced by Anvik Corporation (U.S. Pat. Nos.: 4,924, 257; 5,285,236; and 5,291,240). A key component of the illumination system described in U.S. Pat. No. 5,059,013 is a beam-shaper-uniformizer of polygonal cross-section; that uniformizer is a long, hollow or solid cylinder having a polygonal cross-section, whose internal faces are either first-surface mirrors or totally-internally reflecting surfaces (more precisely, the mirror faces form the outside walls of a tube of polygonal cross-section). That patent briefly describes the cemented mirror panel or polished quartz construction of such a beam-shaper-uniformizer. Such a uniformizer with hexagonal cross-section, for example, could be manufactured by cementing together six identical flat-mirrored parts, each with two 60° bevels along its long dimension. However, experience has shown that it is difficult and costly to fabricate such a cemented-panel, internally-mirrored hexagonal tube. The sharp bevels required are very difficult to grind and polish accurately. Furthermore, angle and width tolerances are difficult to maintain simultaneously, with the result that gaps exist inside the tube along the mirror edges. These gaps produce undesirable scattering when this construction is used as a beam-shaper-uniformizer. Experience has also shown that such a cemented panel construction of a hexagonal internally-mirrored tube is often imprecise, because all six mirrors must be cemented together in a hexagonal configuration which can flatten or otherwise distort before the cement has cured. Moreover, the cement may squeeze into the tube, thereby ruining the mirror surfaces. It is impractical to assemble the panels about a central polygonal mandrel, because a soft, protective padding would be needed to protect the mirror finish and this padding would compromise the precision of assembly. The solid alternative to the hexagonal tube mirror assembly is a polished quartz rod with hexagonal cross-section relying on total internal reflection. Unfortunately, such a quartz rod is not only difficult to fabricate, but also uses prohibitively expensive materials. In short, the known uniformizer constructions suffer from lack of precision, difficulty of fabrication, and/or high cost. A beam-shaper-uniformizer construction eliminating these problems is, therefore, highly desirable.

SUMMARY OF THE INVENTION

It is the object of the invention to provide a precise, low-cost, simplified construction for fabrication of an optical beam-shaper-uniformizer of a precise, polygonal cross-section, the preferred cross-section being a hexagon.

Another object of the invention is to minimize the number of parts needed for the construction to keep costs low.

A feature of the invention is the use of a flat-to-flat stacked slab assembly, to provide an internally-mirrored tube of great precision with remarkable ease of construction. A internally-mirrored tube with a hexagonal cross-section, for example, may be constructed using four beveled-mirror slabs and two flat-mirror slabs. This feature allows the parts to be mechanically clamped together, or, alternately, to be cemented together with small beads of cement well-removed from the active mirror surfaces.

An advantage of the invention is the standardization of costly parts. An internally-mirrored hexagonal tube, for example, requires only two parts—flat and beveled slabs—with no need for an edge sharper than 60°. In fact, the beveled slabs may be made from the flat ones. Moreover, if the top face of the beveled slabs were mirrored in addition to the beveled face, only one part would be needed.

Another advantage of the invention is that the technique scales easily to provide for larger or smaller uniformizers with essentially the same machining and assembly, simply by using beveled mirror slabs of appropriate thicknesses.

Other objects, features and advantages of the invention will be apparent from the following written description, claims, abstract and the attached drawings.

DESCRIPTION OF THE PREFERRED EMBODIMENT

Figures 1A, 1B:
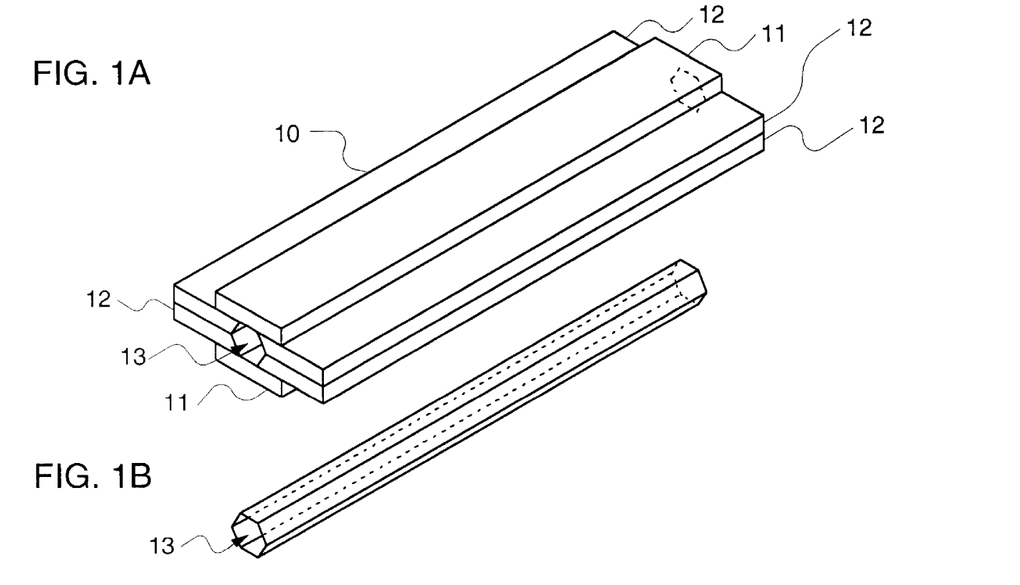
FIG. 1A shows an isometric view of a stacked slab assembly resulting in an internally-mirrored hexagonal tube whose shape is illustrated in FIG 1B.
Figure 1C:
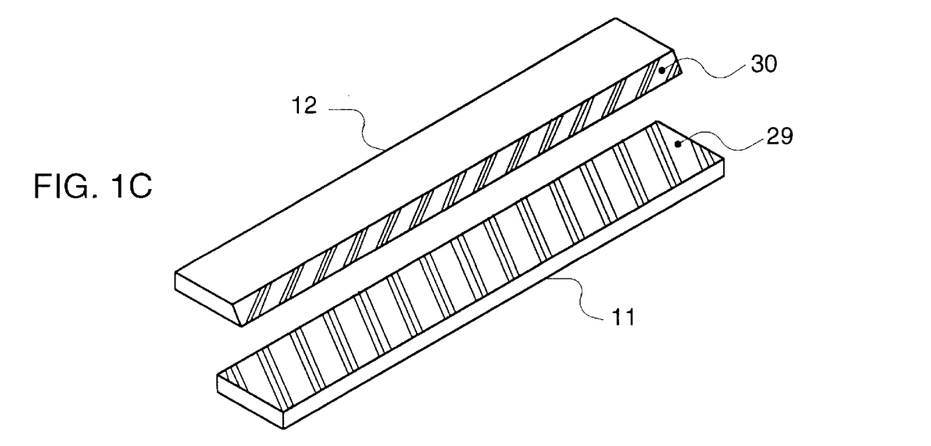
FIG. 1C shows an isometric view of the two types of mirrored slabs required for this assembly.

FIG. 1 shows the construction of an internally-mirrored tube uniformizer 10 with a hexagonal cross-section. It is constructed of flat-mirrored slabs 11 and bevel-mirrored slabs 12 that are fixed together in such a way as to form a hollow region 13 that is shaped like a tube with a hexagonal cross-section. All the internal faces of this tube 13 are mirror coated to be reflective at the wavelength band of interest (for lithographic applications, wavelengths of interest are in the Ultra-Violet). The reflective faces enable a light beam passing through the tube to be multiply reflected as shown schematically in section in FIG. 2.

Figure 2A:
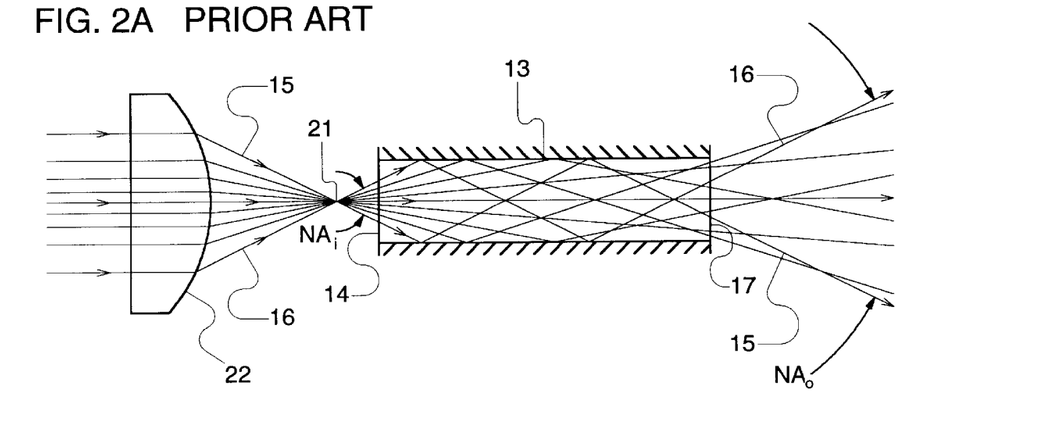
FIGS. 2A and 2B illustrate schematically the function of the beam-shaper-uniformizer, which is shown in section, as developed in prior art.
Figure 2B:
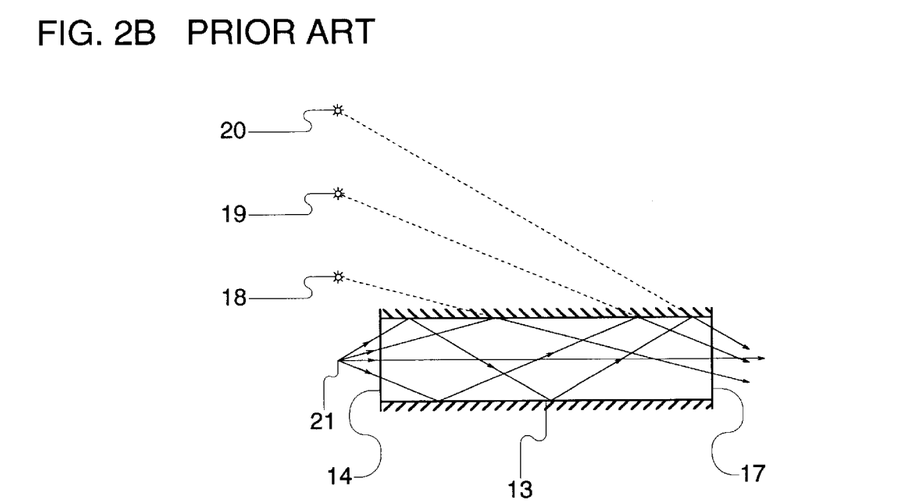

The tube uniformizer 13 accepts at its input end 14 a light beam having a non-uniform intensity profile, an arbitrary cross-sectional shape (usually oval or rectangular), and a specified numerical aperture (shown in FIG. 2 as a bundle of rays bounded by rays 15 and 16) and produces at its output end 17 a beam having a substantially more uniform intensity profile, the desired cross-sectional shape (the preferred embodiment shape being a hexagon), and unchanged numerical aperture. FIG. 2 illustrates schematically how the uniformizer carries out these three transformations of the input light beam. Each transformation is described in turn below.

1. Uniformization of the Intensity Profile—The first and most important transformation effected by the uniformizer is to make the intensity profile of the light at its output 17 substantially more uniform than that of the light at its input 14. It accomplishes this by multiply reflecting the entering light rays. These multiple reflections give rise to an array of apparent point sources 18, 19, and 20 positioned according to the number of reflections undergone by the rays in the tube as shown in FIG. 2B. When the output end of the tube 17 is viewed looking towards the light source, the superposition of the light from all these apparent sources averages out non-uniformities in the intensity profile of the original source. Any rough edges or gaps in the internally-mirrored uniformizer tube will cause the light to scatter in uncontrolled directions. This will bring about highly undesirable non-uniformities in the intensity profile of the light exiting the uniformizer. For this reason, all edges and intersections in the uniformizer tube must be made extremely sharp and accurate.

2. Shaping of the Beam—The second transformation effected by the uniformizer is to give the light beam a desired cross-sectional shape at its output 17 regardless of the shape of the light beam presented at its input 14. The uniformizer tube's cross-sectional shape automatically effects this transformation because the multiply reflected light rays fill up the entire exit aperture 17 of the tube. This exit aperture or output end of the tube 17 can then be imaged to relay the appropriately shaped light beam to any surface of interest. A consequence of this is that any imperfections in the shape will also be relayed. This is why it is important to construct the internally-reflective tube to have a very accurate cross-sectional shape.

3. Preservation of Numerical Aperture—The third transformation effected by the uniformizer is to pass the light beam it is transforming without affecting its divergence, or numerical aperture: there is essentially an identity transformation (no change). The numerical aperture, or NA, of an optical system is a quantity used to specify its light-gathering power. NA is conventionally defined for imaging systems as the sine of the semi-angular aperture in the object space multiplied by the refractive index of the object space. For this invention, which is a non-imaging optical system, NA describes the angular divergence of the light rays entering and exiting the uniformizer. In other words, the NA indicates the angular size of the cone that contains all the light rays entering and exiting the uniformizer. As shown in FIG. 2A, edge rays 15 and 16 bound a cone which contains all the light rays being brought to a focus 21 by the converging lens 22. The input numerical aperture, $NA_i$, is the sine of the half angle of this cone. FIG. 2A shows that rays 15 and 16 make the same angle with respect to each other after being reflected twice inside and then exiting from the uniformizer tube. Thus, the angular size of the cone of light exiting the uniformizer tube is the same as that entering it, or, more succinctly:

$$NA_o = NA_i \quad (1)$$

This is a desirable feature of the uniformizer in the context of its role as a component in the illumination system described in U.S. Pat. No. 5,059,013, by K. Jain. Any inaccuracies in the parallelism of opposing mirror faces in the uniformizer tube will result in condition (1) not being met.

This invention is a novel and improved uniformizer tube construction. The goal of this invention is to construct the internally-mirrored tube in such a way that it can effect all the transformations described above without suffering degradation due to any of the imperfections enumerated. Again, these imperfections are:

a) rough or chipped edges or gapped intersections in the internally-mirrored tube, b) inaccuracies in the cross-sectional shape of the tube, and c) deviations from parallelism of opposing faces in the tube (more generally, deviations from perpendicularity of the internal tube faces with respect to the input and output faces of the tube).

This invention minimizes these imperfections by building up the internally-mirrored tube out of slabs 11 and 12 of mirror-coated glass, of equal thickness, having sharp edges.

This invention minimizes the formation of gaps (imperfection (a)) where the reflective faces of the internally-mirrored tube meet, i.e., at the vertices (23–28) of the polygon describing the cross-section of the tube. It does this by minimizing the number of sharp edges required in the component parts and by allowing the intersections to be formed by the meeting of an edge and a planar surface as opposed to the meeting of two edges. Furthermore, it avoids edges and corners whose interior angle is close to 90° which are very difficult to grind without producing chips and fraying along the edge (sharp acute angles, or knife edges, and significantly obtuse angles, or relief bevels, are produced more easily and accurately in glass than approximately square edges).

This invention takes advantage of the fact that glass may be easily and economically fabricated into extremely flat and parallel slabs with thickness controlled to very close tolerances to ensure that the cross-sectional shape of the tube is produced very accurately and that the perpendicularity of mirror faces and entrance and exit faces is maintained. The simple stacking of such accurately-made slabs of glass automatically insures accurate geometry of the internally-mirrored tube, while dimensions perpendicular to the slab thickness can be easily adjusted with great precision simply by sliding the slabs transversely over each other. In this way, this invention allows the precision of the tube uniformizer 13 to be determined by well-controlled properties of glass plate fabrication rather than by the precision with which a mounting structure can be designed and machined.

The advantages of this invention can be enumerated as follows:

a) this construction is well suited for mass-production;

b) assemblies can be built up from a limited set of identical slabs, in fact, the bevel-edge-mirrored slabs 12 can be made from the flat-mirrored slabs 11;

c) only face 29 on slabs 11 and face 30 on slabs 12 need to be mirrored;

d) other than the mirrored flat on each slab, the only other critical flats are the top and bottom ones, which need to be very flat and parallel to each other; these faces are 31 on slab 11 and 32 and 33 on slab 12;

e) other flats of the slabs are non-critical and, thus, can be left rough-cut;

f) the number of acute or right-angled edges that need to be made sharp is minimized (In hexagonal uniformizer 10, for example, only four sharp edges 34 are acute, and they are at 60°.). Minimization of the number of sharp edges is important because it is very difficult to make such sharp edges in glass; and g) transverse sliding of the slabs along each other allows for accurate adjustment of cross-sectional dimensions.

As an example of the preferred embodiment, FIG. I illustrates that only two types of slabs are required to build up a hexagonal internally-mirrored tube. These slabs are:

a flat-mirrored slab 11 of length L having a rectangular cross-section of width w, thickness t, and mirrored face 29; and a bevel-edge-mirrored slab 12 identical in thickness, and possibly width, to slab 11 except for a mirrored 60° bevel cut along one edge 30.

Figure 3:
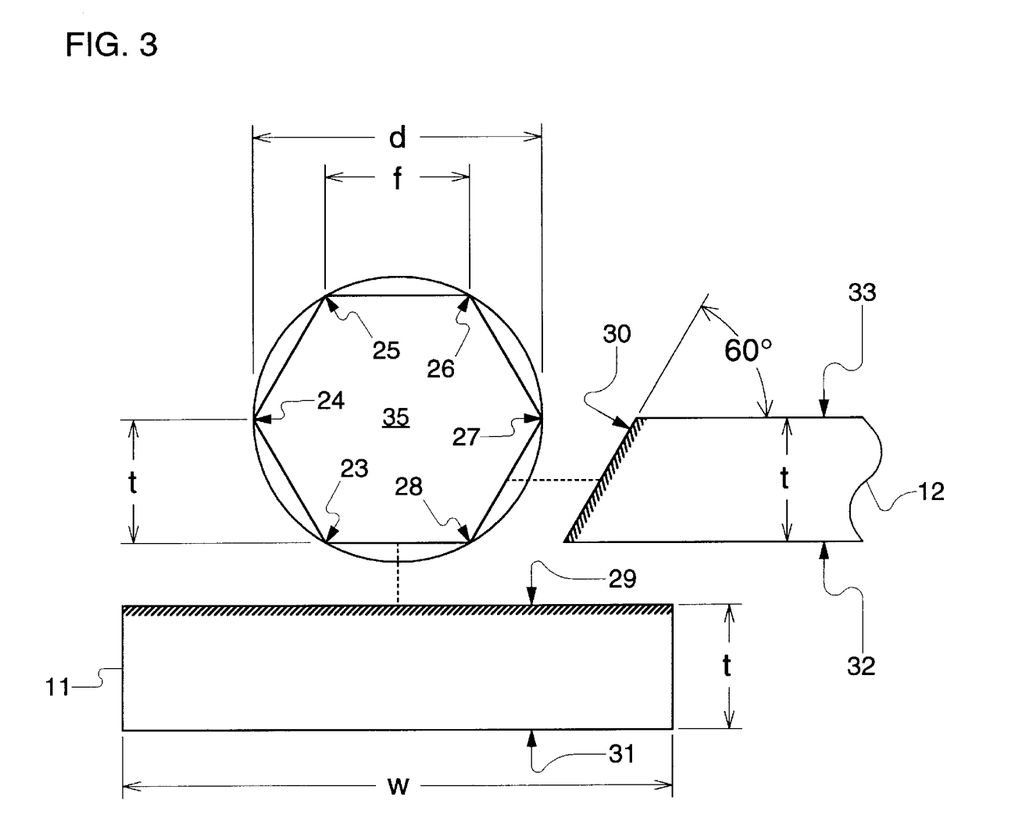
FIG. 3 shows the hexagonal cross-section of the tube along with cross-sections of the slabs needed for its construction.
Figure 4A:
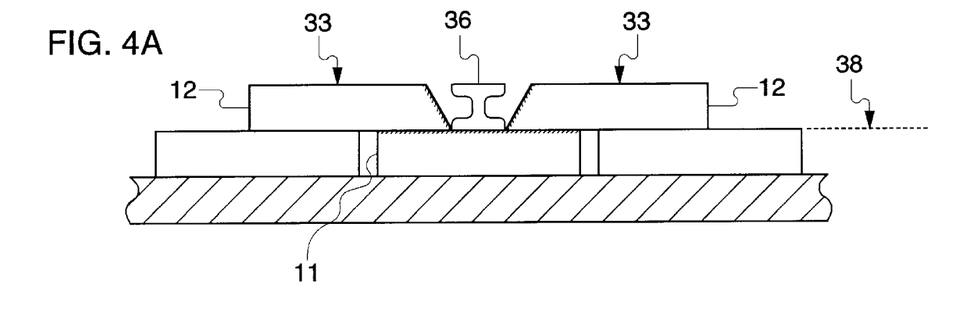
FIGS. 4A, 4B and 4C illustrate a method for assembling the internally-mirrored hexagonal tube uniformizer using a clamping mechanism.
Figure 4B:
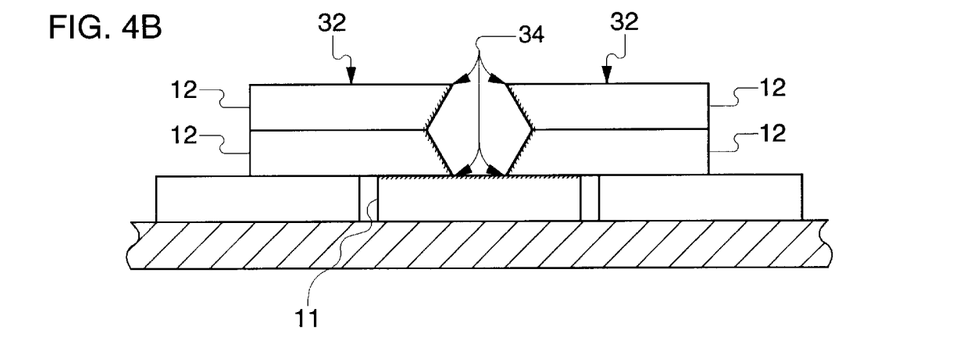
Figure 4C:
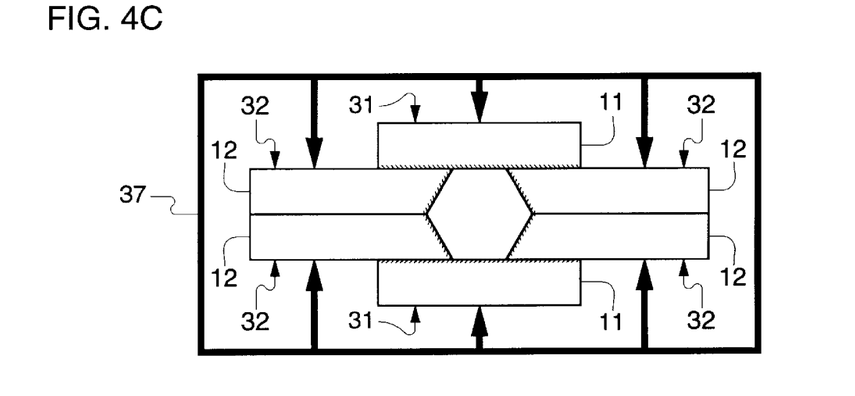
Figure 5A:
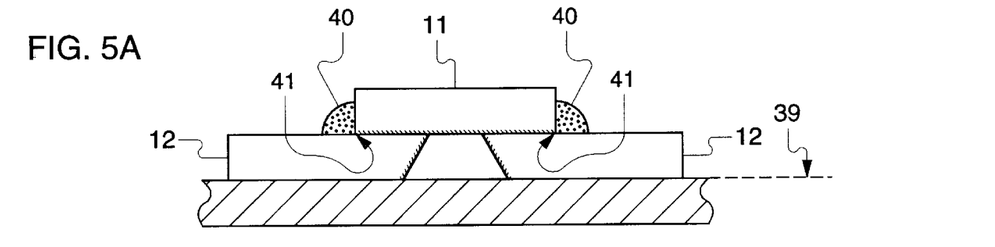
FIGS. 5A, 5B and 5C illustrate an alternative method for assembling the internally-mirrored hexagonal tube uniformizer using cement.
Figure 5B:
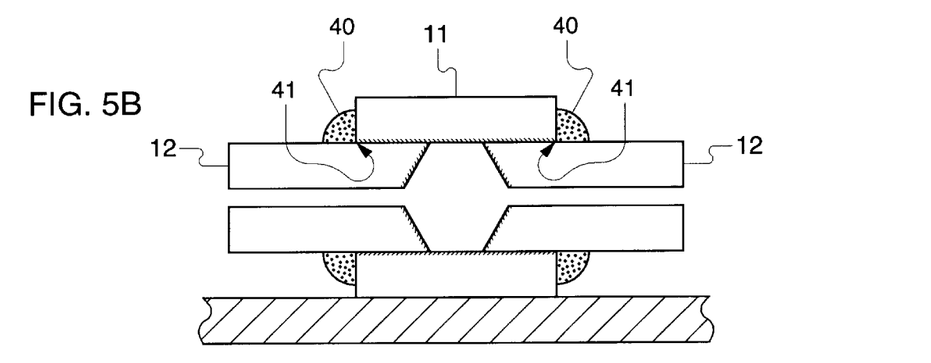
Figure 5C:
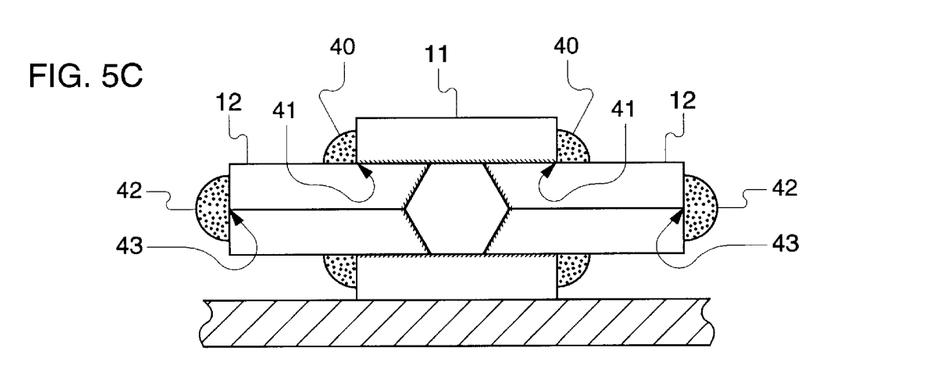

Detailed cross-sections of these slabs are shown in FIG. 3. The width of the bevel-edge-mirrored slab 12 can be chosen quite arbitrarily, and FIGS. 4 and 5 show the width of this slab 12 as being identical to the width of the flat-mirrored slab 11 (this choice may be the most economical). It is apparent from FIG. 3, cross-section 35 that, for a given regular hexagon of face width f, the thickness t of the slabs should be chosen such that $$t = f \sin 50° \tag{2}$$

Figure 6:
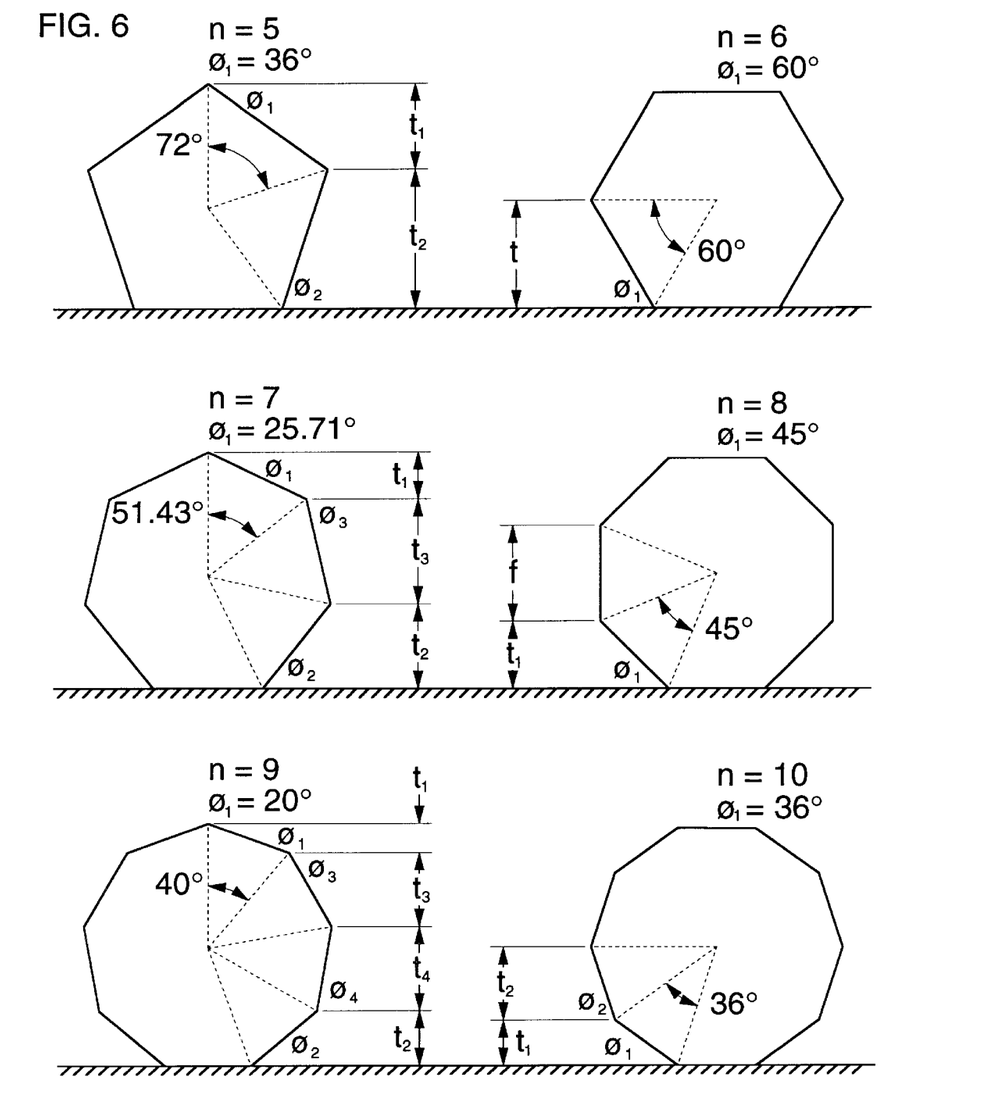
FIG. 6 illustrates how this construction method can be generalized to build internally-mirrored tube uniformizers with any regular polygonal cross-section.

In general, a stacked slab assembly can be designed to produce an internally-mirrored uniformizer tube having almost any regular polygon as its cross-section. As shown in FIG. 3 for a hexagon, any regular polygon can be inscribed in a circle of diameter d for which the face width of the polygon will be given by $$f = d \tan(180°/n) \tag{3}$$

were n is the number of sides of the polygon. FIG. 6 shows regular polygonal cross-sections with five to ten sides, n=5 to 10. A flat-mirrored slab 11 can form one face of any one of these polygons. In addition to this type of slab, a number, m, of different types of beveled slabs will be needed for the construction of a tube with a n-sided polygon as its cross-section. The number m of beveled slab types depends on the number of sides, n, of the regular polygon. Furthermore, each of these types of beveled slabs will be specified by thicknesses, $t_i$, and bevel angles, $\theta_i$, where i goes from 1 to m. It turns out that there are two cases to consider, n even and n odd.

1. For n even, the number of different beveled slab types needed is $$M_e = \text{trunc}[(n-2)/4] \tag{4}$$

where the function trunc[] returns just the integer part of its argument. The bevel angles of the slabs needed are given by $$\theta_i = i \, 360°/n; \, \{i=1, 2, 2, \ldots, m\}. \tag{5}$$

Similar to equation (2) above, the thicknesses of the slabs are given by $$t_i = f \sin \theta_i; \, \{i=1, 2, 3, \ldots, m\}. \tag{6}$$

When n is exactly divisible by 4 an additional slab of thickness f mirrored along one side-edge is also needed.

2. For n odd, the number of different beveled slab types needed is $$M_o = (n-1)/2. \tag{7}$$

The bevel angles of the slabs needed are the same as those needed for a 2n-sided polygon and can be found from an equation similar to (5) above:

$$\theta_i = i \, 180°/n; \, \{i=1, 2, 3, \ldots, m\}. \tag{8}$$

Again, the thicknesses of the slabs are given by equation (6).

The number of complementary pairs of bevel edge mirrored trapezoidal-cross section slabs 12 required depends on whether n, the number of sides of the regular polygon, is odd or even. When n is an odd number, the number of complementary pairs P is given by the formula $$P_o = n-1)/2. \tag{9}$$

When n is an even number, the number of complementary pairs is given by the formula $$P_e = (n-2)/2. \tag{10}$$

The internal angle of the polygon used to construct the uniformizer can readily be determined once the number of sides n is known. The internal angle A is given by the equation $$A = (n-2)*180°/n. \tag{11}$$

It is irrelevant whether there are an odd or even number of sides, this equation is applicable to both situations.

METHOD OF CONSTRUCTION

The desired uniformizer tube is built up by simply stacking the bevel-edge-mirrored slabs 12 in pairs (FIGS. 4A through 4C), in the correct order, atop the flat-mirrored base slab 11, and, where required, adding a final flat-mirrored slab to the top. Precision of the cross-sectional shape is accomplished easily by adjusting the bevel edge separations through controlled sliding with respect to the stack's base slab. A tool such as 36 may be used to insure accuracy. Once adjusted, the slabs may be fixed in a suitable mount 37, such as that shown schematically in FIG. 4C. The hexagonal tube uniformizer 10 is, thus, a stacked assembly of two rectangular flat-mirrored slabs 11 and four bevel-edge-mirrored slabs 12. The length of the tube uniformizer 10 can be extended by using longer slabs, or by adding additional stacked uniformizer assemblies 10 end to end. It is readily apparent that, if the slabs are ground to close tolerances, have very flat and parallel top and bottom faces, and have sharp edges, the gaps formed along the vertices of the polygon will be very small.

The detailed method of constructing a hexagonal tube uniformizer, is characterized by the following steps:

a) laying down a base flat-mirrored slab 11 with mirror face 29 directed into the polygonal hollow tube to form a first mirrored face with a datum plane 38 extending outward (this datum plane may be extended by using additional flat-mirrored slabs or tools of the appropriate thickness);

b) stacking, outside the dimensions of the hexagonal hollow tube, on the datum plane, two complementary pairs of bevel-edge-mirrored slabs 12 directed into the polygonal hollow tube to form second through fifth mirrored faces;

c) applying a completion flat-mirrored slab 11 with mirror face 29 directed into the hexagonal hollow prism to form a sixth mirrored face; and d) affixing all the slabs 11 and 12 into a unitary assembly with an appropriate clamping assembly 37.

An alternative method of assembly involving cement is illustrated in FIG. 5. In this construction, the uniformizer tube is built up from two identical cemented half-assemblies, FIGS. 5A and 5B. Each assembly is made by the following process. First, two bevel-edge-mirrored slabs 12 are placed on a datum surface 39 such as a precision surface plate, and their separation is precisely adjusted by laterally sliding the slabs along the datum surface 39. Second, the flat-mirrored slab 11 is placed on top of the two bevel-edge-mirrored slabs 12 as shown in FIG. 5A. Note that the transverse positioning of the flat-mirrored slab 11 is not critical. Finally, a bead of appropriate cement 40 is applied along the exposed joint 41 between the flat-mirrored slab 11 and the bevel-edge-mirrored slabs 12. When the cement has cured the three slabs form a half-assembly of the uniformizer tube, FIG. 5A. Two uniformizer tube half-assemblies are then positioned with respect to each other as shown in FIG. 5B. Once the two half-assemblies have been aligned to each other as in FIG. 5C, a bead of cement 42 is applied to the exposed joint between them 43, thereby completing the assembly. It will be noted that the cement 40, 42 is well-removed from the critical internal faces of the uniformizer tube and that all joints 41, 43 to be cemented are readily accessible.

Although the hexagonal tube uniformizer 10 is the preferred embodiment, other cross-sectional shapes may be used (FIG. 6). By designing appropriate beveled slabs as described above, the cross-section can be almost any polygon. Bevel-edge-mirrored slabs of the same type can be turned over and reversed, so that a single type of slab can be used four times in each even-sided polygon construction and twice in each odd-sided polygon construction. As mentioned above, polygons with n divisible by 4 exactly also require additional side-edge-mirrored slabs of thickness f. An octagon, for example, requires two side-edge-mirrored slabs, two flat-mirrored slabs, and four 45° bevel-mirrored slabs.

The method of construction does not change significantly for regular polygonal cross sections other than the hexagon, except that the number of slab types will change.

SUMMARY

When used as a beam-shaper-uniformizer, this invention provides several improvements in performance over previous hollow reflector constructions. Key among these is that this invention reduces the amount of scattering due to gaps and imperfections along mirror edges. Scattering produces undesirable non-uniformities in the transverse intensity profile of the light exiting from a hollow reflector. Another advantage is that this invention allows for the reflective coating of the mirror faces to be done after fabrication of the slabs, which results in improved reflecting surfaces. Furthermore, since this invention allows the reflector assembly to be constructed of slabs of the same material, defects due to thermal expansion can be minimized.

While the invention has been described in the context of a hexagonal internally-mirrored uniformizer, it will be apparent to the person skilled in the art that the technique may be modified by adjusting bevel angles and the number of slabs, and may be used for producing a variety of internally-precise polygonal hollow prisms, in accordance with the following claims.

I claim:

1. The method of constructing a hexagonal internally-mirrored tube uniformizer (10) of uniform cross-section, for use in accepting a light beam with a given numerical aperture, a non-uniform intensity profile and an arbitrary cross-section, and producing a beam of the same numerical aperture with a substantially uniform intensity profile and a hexagonal cross-sectional shape, characterized by the following steps:

a) laying down a base flat-mirrored panel (11) with mirror face (29) directed into the tube to form a first mirrored face and a datum plane extending outward from said first mirrored face;

b) stacking, outside the dimensions of the hexagonal tube, on said datum plane, two complementary pairs of bevel-edge mirrored trapezoidal-cross-section slabs (12), each with thickness t with mirrored 60° bevel edges of length L, directed into the tube to form second through fifth mirrored faces;

c) applying a completion flat-mirrored panel (11) with mirror face (29) directed into the tube to form a sixth mirrored face of width f with a datum plane extending outward and resting on said two complementary pairs; and d) affixing said slabs and said panels into an integral internally-mirrored hexagonal tube assembly.

2. The method of constructing an n sided polygonal internally-mirrored tube uniformizer (10) of uniform cross-section and length L, wherein the open polygonal cross-section has n odd equal sides of width f and n equal internal angles of (n−2)*180°/n each, for use in accepting a light beam with a given numerical aperture, a non-uniform intensity profile and an arbitrary cross-section, and producing a beam of the same numerical aperture with a substantially uniform intensity profile and a polygonal cross-sectional shape, characterized by the following steps:

a) laying down a base flat-mirrored panel (11) with mirror face (29) directed into the tube to form a first mirrored face and a datum plane (38) extending outward from said first mirrored face;

b) stacking, outside the dimensions of the polygonal tube, on said datum plane, (n−1)/2 complementary pairs of bevel-edge mirrored trapezoidal-cross-section slabs (12), with mirrored bevel edges of dimension f, directed into the tube to form second through nth mirrored faces; and c) adjusting and affixing said slabs and said panels into an integral internally-mirrored polygonal tube assembly.

3. The method of constructing an n sided polygonal internally-mirrored tube uniformizer (10) of uniform cross section and of length L, for which n, is divisible by four, the sides are of equal width f and the polygon has $n_e$ equal internal angles of (n−2)*180°/n each, for use in accepting a light beam with a given numerical aperture, a non-uniform intensity profile and an arbitrary cross-section, and producing a beam of the same numerical aperture with a substantially uniform intensity profile and a polygonal cross-sectional shape, characterized by the following steps:

a) laying down a base flat-mirrored panel (11) with mirror face (29) directed into the tube to form a first mirrored face and a datum plane extending outward from said first mirrored face;

b) stacking, outside the dimensions of the polygonal tube, on said datum plane, if n>4, complementary pairs of bevel-edge mirrored trapezoidal-cross-section slabs (12), with mirrored bevel edges of dimension f, directed into the tube to form second through (n/2−1)th mirrored faces;

c) stacking, outside the dimensions of the polygonal tube, on said pairs of bevel-edge mirrored trapezoidal slabs, a complementary pair of flat-edge mirrored slabs of thickness f, directed into the tube to form (n/2)th and (n/2+1)th mirrored faces;

d) stacking, outside the dimensions of the polygonal tube, on said pair of flat-edge mirrored slabs, if n>4, complementary pairs of bevel-edge mirrored trapezoidal slabs (12), with mirrored bevel edges of dimension f, directed into the tube to form (n/2+2)th through (n−1)th mirrored faces;

e) applying a completion flat-mirrored panel (11) with mirror face (29) directed into the polygonal tube to form an nth mirrored face of width f with a datum plane extending outward and resting on said complementary pairs; and f) adjusting and affixing said slabs and said panels into an integral internally-mirrored polygonal tube assembly.

4. The method of constructing an n sided internally-mirrored polygonal hollow tube uniformizer (10), wherein the hollow tube has a constant polygonal cross section and length L, the n number of sides of the polygonal cross section is even but not divisible by four, the sides are of equal width f and the polygon has $n_e$ equal internal angles of $(n-2)*180°/n$ each, for use in accepting a light beam with a given numerical aperture, a non-uniform intensity profile and an arbitrary cross-section, and producing a beam of the same numerical aperture with a substantially uniform intensity profile and a polygonal cross-sectional shape, characterized by the following steps:

a) laying down a base flat-mirrored panel (11) with mirror face (29) directed into the hollow tube to form a first mirrored face and a datum plane extending outward from said first mirrored face;

b) stacking, outside the dimensions of the polygonal hollow tube, on the said datum plane, (n−2)/2 complementary pairs of bevel-edge mirrored trapezoidal-cross-section slabs (12), with mirrored bevel edges of dimension f, directed into the prism to form second through $(n-1)^{th}$ mirrored faces;

c) applying a completion flat-mirrored panel (11) with mirror face (29) directed into the polygonal hollow tube to form an nth mirrored face of width f with a datum plane extending outward and resting on said complementary pairs; and d) adjusting and affixing said slabs and said panels into an integral internally-mirrored polygonal open-prism assembly.

5. A stacked slab hollow prism-shaped internally mirrored uniformizer (10) of constant hexagonal cross-section, for use in accepting a beam of a given numerical aperture, a non-uniform intensity profile and an arbitrary cross-section, and producing a beam of the same numerical aperture with a substantially uniform intensity profile and a hexagonal cross-sectional shape, characterized by:

a) a base flat-mirrored panel (11) with mirror face (29) directed into the tube to form a first mirrored face and a datum plane (38) extending outward from said first mirrored face;

b) a stack, outside the dimensions of the hexagonal tube, on said datum plane, of two complementary pairs of bevel-edge mirrored trapezoidal-cross-section slabs (12), each with thickness f*sin 60°, with mirrored bevel edges of dimension f, directed into the tube to form second through fifth mirrored faces;

c) a completion flat-mirrored panel (11) with mirror face (29) directed into the hexagonal hollow prism to form a sixth mirrored face of width f with a datum plane extending outward and resting on said two complementary pairs; and d) affixing means to affix said slabs and said panels together in an integral internally-mirrored hexagonal tube assembly.

6. A stacked slab internally mirrored tube uniformizer according to claim 5,
wherein said affixing means are beads of epoxy cement (40, 42) outside the space between the slabs.

7. A stacked slab internally mirrored tube uniformizer according to claim 5,
wherein said affixing means is a clamp (37) outside the space between said slabs.

8. A stacked slab internally-mirrored n sided tube uniformizer (10), of constant polygonal cross-section, having n equal sides of length L, n being an even number, for use in accepting a light beam with a given numerical aperture, a non-uniform intensity profile and arbitrary cross-section, and producing a beam of the same numerical aperture with a substantially uniform intensity profile and a polygonal cross-sectional shape, characterized by:

a) a base flat-mirrored panel (11) of length L with mirror face (29) directed into the tube to form a first mirrored face and a datum plane (38) extending outward from said first mirrored face;

b) a stack, outside the dimensions of the polygonal tube, on the said datum plane, having (n−2)/2 complementary pairs of bevel-edge mirrored trapezoidal-cross-section slabs (12), with mirrored bevel edges of dimension f, directed into the hollow prism to form second through $(n-1)^{th}$ mirrored faces;

c) a completion flat-mirrored panel (11) with mirror face (29) directed into the polygonal tube to form an nth mirrored face of width f with a datum plane extending outward and resting on said complementary pairs; and d) affixing said slabs and said panels into an integral internally-mirrored polygonal hollow prism assembly.

9. An internally mirrored n sided tube uniformizer, with a constant, n-sided polygonal cross-section, comprising:

a) at least one mirrored base panel with a datum plane extending beyond the mirror dimension of a base side of said n-sided hollow prism;

b) a number of beveled mirrored edge slabs, each of thickness and grind appropriate to provide the appropriate bevel angle and bevel dimension to complete the n-sided polygon; and c) means to affix said at least one mirrored base panel and said slabs into an integral internally-mirrored polygonal tube assembly.

10. An n-sided optical tube made by the following process:

a) laying down a base mirrored panel (11) with mirror face (29) directed into the tube to form a first mirrored face and a datum plane extending outward from said first mirrored face;

b) stacking, outside the dimensions of the polygonal tube, on said datum plane, edge-mirrored slabs (12), with mirrored edges (30) directed into the tube to form second through nth mirrored faces, the last of the n sides of the polygon; and c) adjusting and affixing said slabs and said panels into an integral internally-mirrored optical tube assembly.

11. An optical tube according to claim 10 wherein the number of sides of the tube is six.

12. An optical tube according to claim 10 wherein the mirrored internal sides of the tube are flat and identically configured.

13. An optical tube according to claim 10 wherein the internal sides of the tube are configured with curvature.

14. An optical tube according to claim 10 wherein the number of mirrored internal sides of the tube is six.

15. An optical tube according to claim 10 wherein the mirrored internal sides of the tube are identically configured and six in number.

* * * * *